(12) United States Patent
Abesingha

(10) Patent No.: US 11,496,126 B1
(45) Date of Patent: Nov. 8, 2022

(54) CIRCUITS AND METHODS FOR LEAKAGE REDUCTION IN MOS DEVICES

(71) Applicant: pSemi Corporation, San Diego, CA (US)

(72) Inventor: Buddhika Abesingha, Escondido, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 17/495,709

(22) Filed: Oct. 6, 2021

(51) Int. Cl.
  *H03K 17/00* (2006.01)
  *H03K 17/16* (2006.01)
  *H03K 17/687* (2006.01)

(52) U.S. Cl.
  CPC ......... *H03K 17/161* (2013.01); *H03K 17/165* (2013.01); *H03K 17/687* (2013.01)

(58) Field of Classification Search
  None
  See application file for complete search history.

(56) References Cited

U.S. PATENT DOCUMENTS

| | | | | |
|---|---|---|---|---|
| 11,079,785 | B2* | 8/2021 | Hashiguchi | B60L 3/0046 |
| 2003/0218450 | A1* | 11/2003 | Bonte | G05F 1/575 |
| | | | | 323/273 |
| 2020/0278713 | A1* | 9/2020 | Hashemi | G06F 1/28 |
| 2021/0311513 | A1* | 10/2021 | Joshi | G05F 1/575 |
| 2021/0389790 | A1* | 12/2021 | Raducan | G05F 1/569 |

* cited by examiner

*Primary Examiner* — Tuan T Lam
(74) *Attorney, Agent, or Firm* — Steinfl + Bruno LLP

(57) ABSTRACT

Various methods and circuital arrangements for leakage reduction in MOS devices are presented. A pull-up circuit is selectively coupled to a gate of the MOS device to provide control of a voltage to the gate that is larger than a source voltage. Voltage switching circuits selectively couple different voltages to the body and/or back-gate terminals of the MOS device. During a standby mode of operation, the leakage current of the MOS device is decreased by driving the MOS device further into its subthreshold leakage region. During the standby mode, a threshold voltage of the MOS device is increased by coupling a voltage higher than the source voltage to the body and/or back-gate terminals. The MOS device can be a pass device used in low dropout regulator (LDO). During the standby mode, the LDO maintains output regulation by driving the MOS device further into its subthreshold leakage region and/or increasing the threshold voltage.

23 Claims, 12 Drawing Sheets

US 11,496,126 B1

CIRCUITS AND METHODS FOR LEAKAGE REDUCTION IN MOS DEVICES

TECHNICAL FIELD

The present application generally relates to electronic circuitry, and more specifically to circuits that use large size transistor devices to pass large currents during normal operation and which may need to operate in a standby mode with low leakage currents.

BACKGROUND

Electronic circuits (circuital arrangements), including those used in radio frequency (RF) applications, may operate according to at least two different modes of operation: an active mode wherein high currents flow through the circuits; and an inactive mode, or standby mode, wherein currents through the circuits are reduced. A goal during operation in the standby mode may be to minimize the currents flowing through the circuits. For example, considering a portable device, such as a mobile communication device, which is typically powered by a (rechargeable) battery, by minimizing leakage of currents from the battery to RF circuit blocks during the standby mode of operation, a recharge period of the portable device, or time intervals between recharges of the battery, may be substantially extended.

Power converters are typically used to convert a voltage from a rechargeable battery to an output voltage provided to the RF circuit blocks. One such well-known in the art power converter is a low dropout (LDO) regulator which can be used to provide regulated power (e.g., voltage) at a level close to a level of an input power source, such as a battery. FIG. 1A shows an exemplary case of an LDO regulator (100A) which can convert an unregulated input voltage, $V_{DD}$, to an output regulated voltage, $V_{OUT}$, that may be used to power the RF circuit blocks of a portable device, such RF circuits blocks represented in FIG. 1A by a load, $R_L$.

With continued reference to FIG. 1A, the LDO regulator (100A) comprises an error amplifier (e.g., error amplifier, 150) whose output is connected to a gate of a P-type MOSFET (PMOS) transistor device, $M_{PASS}$, that is capable of providing to the load, $R_L$, currents high enough for operation during the active mode at the output regulated voltage, $V_{OUT}$. As shown in FIG. 1A, the output voltage, $V_{OUT}$, is sampled at a node, FB, that is provided via a resistive voltage divider formed by resistors (R1, R2). A sampled output voltage at the node, FB, that is a scaled (down) version of the output voltage, is fed back to the positive input terminal of the error amplifier (150), to create a closed loop control of the output voltage, $V_{OUT}$, such as to track a reference voltage, $V_{REF}$, fed to the inverting input terminal of the error amplifier (150). In the described closed loop mode of operation, the LDO regulator (100A) regulates the output voltage, $V_{OUT}$, to remain substantially constant irrespective of the current required by the load, $R_L$. This is accomplished by controlling/adjusting a gate voltage, $V_G$, to the gate of the PMOS device, $M_{PASS}$, based on an error voltage equal to a difference between the sampled output voltage at the node, FB, and the reference voltage, $V_{REF}$. A capacitor, $C_{OUT}$, charged at the output voltage, $V_{OUT}$, may be used to reduce ripples at the load, $R_L$.

During the active mode of operation, the load, $R_L$, may demand a high current, for example, in the 100's of milliamps, and therefore the error amplifier (150) may output a gate voltage, $V_G$, such as a current flowing from the source (labelled as $V_S$) to the drain (labeled as $V_D$) of the PMOS device, $M_{PASS}$, is essentially equal to the demanded high current through the load, $R_L$, plus a current necessary to generate the sampled voltage at the node, FB. On the other hand, during the inactive/standby mode of operation, the load $R_L$ may demand a substantially reduced current, in the orders of micro- to nano- amps, or even smaller. Accordingly, the error amplifier (150) may output a gate voltage, $V_G$, such that a current flowing from the source to the drain of the PMOS device, $M_{PASS}$, is essentially equal to the demanded low current (e.g., standby current) through the load, $R_L$, plus a current necessary to generate the sampled voltage at the node, FB. It is noted that in this case, it is assumed that regulation of the output voltage, $V_{OUT}$, is desired during both modes of operation, such as to allow, for example, a fast recovery/startup of the RF circuit blocks when switching from the standby mode to the active mode of operation.

With continued reference to FIG. 1A, lowering of the current when switching from the active mode to the inactive/standby mode of operation may be provided by increasing the gate voltage, $V_G$, to the PMOS device, $M_{PASS}$. It should be noted that a high value of the gate voltage, $V_G$, output by the error amplifier (150), is bounded by the supply voltage to the error amplifier (150), and therefore bounded by $V_{DD}$. In other words, the minimum current through the PMOS device, $M_{PASS}$, shown in FIG. 1A is provided when $V_G$ is at its high value (essentially) equal to $V_{DD}$.

As known to a person skilled in the art, the PMOS device, $M_{PASS}$, also referred to as a pass device or a pass transistor, may be sized according to the high current demand during operation in the active mode such as to reduce an ON resistance of the PMOS device for a sufficiently low drain-to-source voltage drop. As known to a person skilled in the art, the larger the size of a PMOS device, the larger the leakage current through the device for the OFF condition where the gate-to-source voltage $V_{GS}$ is less negative than Vth, where Vth is the threshold voltage of the PMOS device. In other words, in the OFF condition of the PMOS device, where $V_{GS}$ is less negative than Vth, there may exist a leakage current through the pass device that may be on the order of few 10's of microamps. The error amplifier 150 as deployed in the prior art circuit shown in FIG. 1A is unable to reduce this leakage current through the pass device by controlling the gate of the pass device. In some cases, such leakage current may be larger than the standby current demanded by the load $R_L$, and therefore, the portion of the leakage current that is not provided to the load, $R_L$, flows into the output capacitor $C_{OUT}$ such that the output voltage, $V_{OUT}$, increases from the regulation voltage to a point that LDO loses regulation and may reach a higher level that may be equal to $V_{DD}$. In turn, such higher level of the output voltage, $V_{OUT}$, may cause an overvoltage condition on components at the load, $R_L$, and/or other related reliability concerns of such components. Furthermore, the leakage current per se may be a source of undesired power dissipation during the standby mode of operation, thereby requiring shorter time intervals between recharges of the battery.

Teachings according to the present disclosure overcome the above prior art shortcoming by reducing the amount of leakage current during the standby mode of operation while maintaining regulation of the output voltage.

SUMMARY

According to a first aspect of the present disclosure, a circuital arrangement is presented, comprising: a PMOS transistor device comprising: a source terminal coupled to a supply voltage; a drain terminal configured to be coupled to a load; and a gate terminal configured to control a current between the source terminal and the drain terminal; an error amplifier comprising an output coupled to the gate terminal, the error amplifier powered by the supply voltage; and a voltage switching circuit configured to selectively couple a first high voltage that is higher than the supply voltage to the output of the error amplifier, wherein the circuital arrangement is configured to operate according to at least a first mode and a second mode, during operation in the first mode, the voltage switching circuit decouples the first high voltage from the output of the error amplifier so that an upper bound of a range of a control voltage at the output of the error amplifier is provided by the supply voltage, and during operation in the second mode, the voltage switching circuit couples the first high voltage to the output of the error amplifier so to extend the range of the control voltage above the supply voltage.

According to a second aspect of the present disclosure, a method for reducing leakage current through a PMOS device is presented, the method comprising: providing selective control of a gate-to-source voltage of the PMOS device according to a first voltage range that extends from a negative voltage to zero volts, or a second voltage range that extends from zero volts to a positive voltage; during an active mode of operation, selecting control according to the first voltage range, thereby controlling a current through the PMOS device from a high current to a leakage current; and during a standby mode of operation, selecting control according to the second voltage range, thereby controlling the current through the PMOS device to a value that is lower than the leakage current.

According to a third aspect of the present disclosure, a circuital arrangement is presented, comprising: an NMOS transistor device comprising: a drain terminal coupled to a supply voltage; a source terminal configured to be coupled to a load; and a gate terminal configured to control a current between the drain terminal and the source terminal; an error amplifier comprising an output coupled to the gate terminal; and a voltage switching circuit configured to selectively couple a low voltage that is lower than a reference ground voltage to the output of the error amplifier, wherein the circuital arrangement is configured to operate according to at least a first mode and a second mode, during operation in the first mode, the voltage switching circuit decouples the low voltage from the output of the error amplifier so that a lower bound of a range of a control voltage at the output of the error amplifier is provided by the reference ground voltage, and during operation in the second mode, the voltage switching circuit couples the low voltage to the output of the error amplifier so to extend the range of the control voltage below the reference ground voltage.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1A:
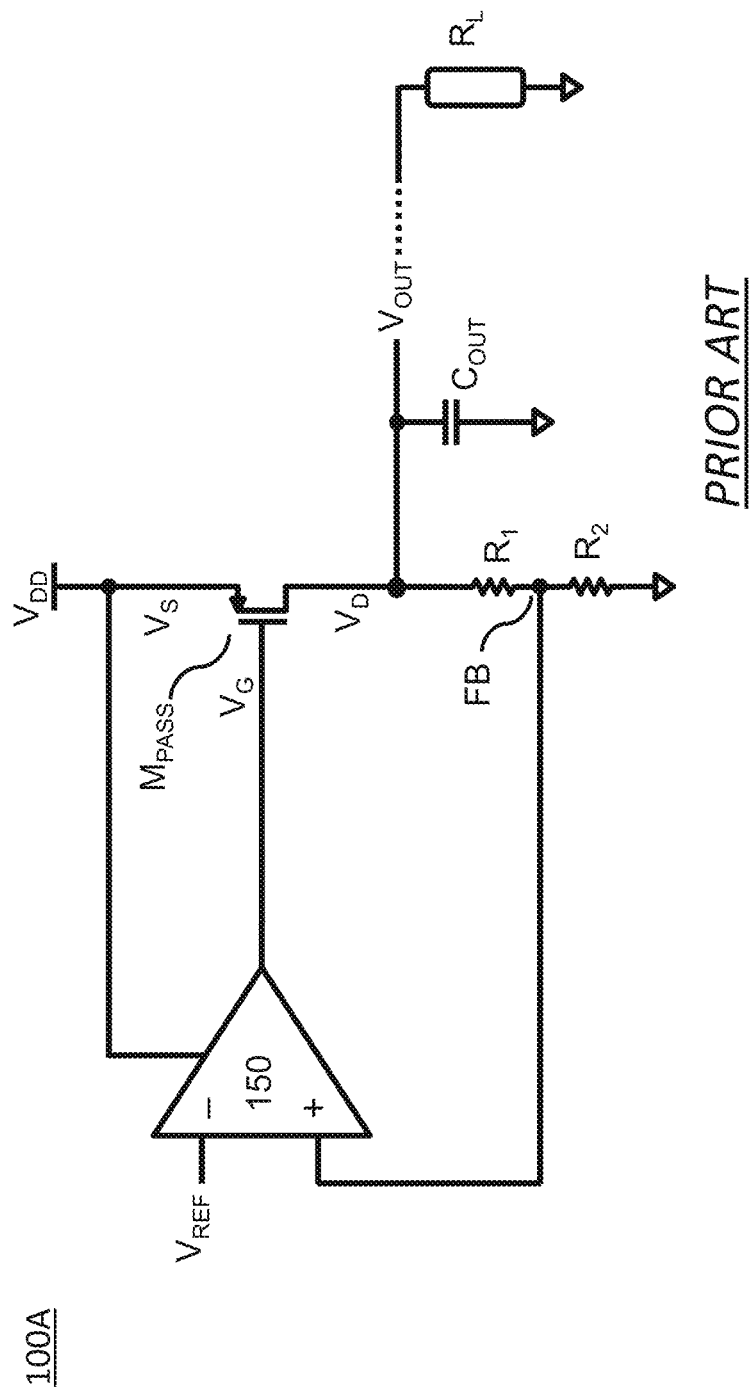
FIG. 1A shows a prior art configuration of a low voltage regulator (LDO) that controls current through a PMOS device.
Figure 1B:
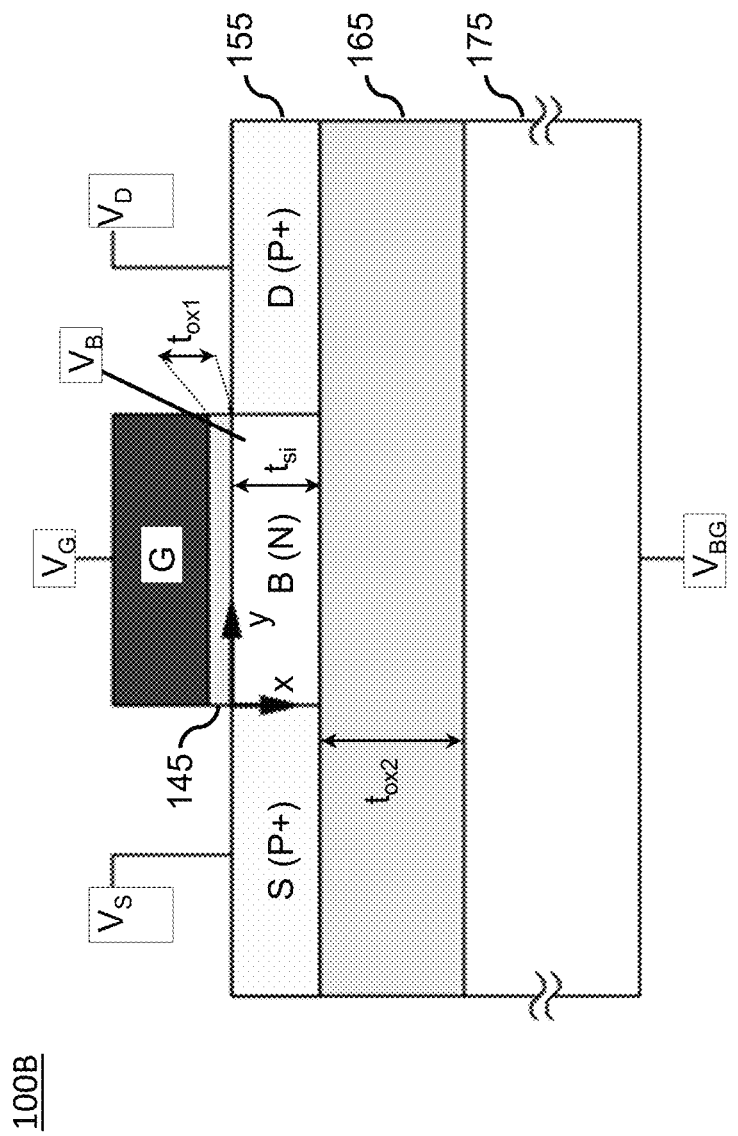
FIG. 1B shows a simplified cross sectional view of an SOI PMOS device.

FIG. 1B shows a cross sectional view (e.g., in an x, y plane) of a simplified PMOS transistor device (100B) which may be used to control current in a power converter application, such as, for example, in a low voltage regulator (LDO). A person skilled in the art will recognize that the structure of the PMOS transistor device (100B) is according to a layered silicon on insulator (SOI) CMOS semiconductor technology, which includes a substrate (175), a buried oxide layer (165) having a thickness $t_{OX2}$ overlying the substrate (175), and a silicon layer (155) having a thickness $t_{Si}$, overlying the buried oxide layer (165). The silicon layer (155) includes an N-type body region, B, that is flanked by doped P-type source, S, and drain, D, regions. A thin oxide layer (145) having a thickness $t_{OX1}$ separates the body region, B, from a gate, G, of the PMOS transistor device (100B).

Operation of the PMOS transistor device (100B) may be controlled via voltages $V_S$, $V_G$ and $V_D$ respectively applied to the source, S, the gate, G, and the drain, D, terminals of the device. In particular, a current from the source, S, to the drain, D, of the PMOS transistor device (100B) may be controlled via a gate-to-source voltage ($V_{GS}=V_G-V_S$) in view of well-known in the art (I-V) characteristics of such device. As is well known, NMOS FETs operate on positive voltages and PMOS FETs operate on negative voltages, which can cause confusion. In the present disclosure, firstly provided is description of leakage current reduction for a PMOS pass transistor (e.g., FIG. 2 and FIG. 4) which typically has a negative Vth and a negative drain-to-source voltage, $V_{DS}$. As is well known, for such PMOS pass transistor, $V_{GS}$ voltages more negative than Vth induce relatively large currents in the saturation or linear regions. Conversely, $V_{GS}$ voltages less negative (or even positive) than Vth induce relatively small currents in the subthreshold region of the PMOS pass transistor. In the later provided description of leakage current reduction for an NMOS pass transistor (e.g., FIGS. 5-6), the operating voltages of the NMOS device have polarities reversed compared to corresponding operating voltages of the PMOS device, the operating voltages being $V_{GS}$, $V_{DS}$ and Vth, as well as body-to-source and back-gate-to-source voltages.

As described above, the leakage current may be a function of a size (e.g., ratio W/L of width, W, to length, L) of the PMOS transistor device (100B), with larger sizes (e.g., W/L) resulting in larger leakage currents. Adjusting the $V_{GS}$ voltage relative to Vth (i.e., less negative for PMOS) may further decrease the leakage current by operating the device further into the subthreshold leakage region. As known by a person skilled in the art, at least within a portion of the subthreshold leakage region, starting at the threshold voltage, Vth, the leakage current is an exponential function of the voltage $V_{GS}$. In other words, for a fixed (e.g., substantially fixed or slowly varying) value of the source voltage, $V_S$, of the device (100B), less negative values of $V_{GS}$ result in an exponential decrease of the leakage current. Such exponential current decrease may continue for $V_{GS}$ in the subthreshold region until a leakage current floor is observed, often at $V_{GS}$ voltages more positive than 0V. The extent by which this exponential decrease of the leakage current continues may be a function of characteristics of the PMOS transistor device (100B) which can be determined using readily available tools.

Teachings according to the present disclosure take advantage of the exponential decrease behavior of the PMOS transistor device (100B) when operating within its subthreshold leakage region by controlling the gate voltage, $V_G$, to values above the source voltage, $V_S$. Such control may be selective and in view of a mode of operation of the circuit at the load (e.g., $R_L$ of FIG. 2A later described). Accordingly, during the standby mode of operation, leakage currents through the PMOS transistor device (100B) can be substantially reduced to levels at or below the standby current of the load (e.g., $R_L$ of FIG. 2A later described). In turn, when considering for example operation of an LDO (e.g., 200A of FIG. 2A later described), a current through a corresponding PMOS device (e.g., $M_{PASS}$ of FIG. 2A), can be controlled such as to maintain regulation of the output voltage, $V_{OUT}$, during operation in the standby mode (e.g., as shown in graphs of FIG. 2C later described).

Control of the leakage current based on the gate voltage, $V_G$, as described above, may be considered as a first order control. As known to a person skilled in the art, further (second order) control of the leakage current, whether direct or indirect, may be provided via biasing of a body terminal and/or of a back-gate terminal of a PMOS device. For example, considering the PMOS transistor device (100B) shown in FIG. 1B, a voltage $V_B$ at a terminal of the body, B, may affect the threshold voltage, Vth, of the device (100B) according to the well-known in the art body effect. Such body effect represents a change in the threshold voltage, Vth, by an amount that is approximately equal to a change in the body-to-source voltage ($V_{BS}=V_B-V_S$). Albeit at a lesser degree, a change of the threshold voltage, Vth, may also be observed based on a change in the back-gate-to-source voltage ($V_{BG}-V_S$) of the PMOS transistor device (100B). Accordingly, by increasing the body voltage $V_B$ and/or the back-gate voltage $V_{BG}$ with respect to the (substantially fixed or slow varying) source voltage $V_S$, the threshold voltage, Vth, can be made more negative by an amount that may be proportional to the respective increase of the body voltage, $V_B$, and/or the back-gate voltage, $V_{BG}$. Such change in the threshold voltage, Vth, can push operation of the PMOS transistor device (100B) further into the subthreshold leakage region for a given value of $V_{GS}$, thereby reducing the leakage current for said value of the gate-to-source voltage, $V_{GS}$.

It follows that teachings according to the present disclosure may control the body voltage, $V_B$, and/or the back-gate voltage, $V_{BG}$, to affect the threshold voltage, Vth, and therefore the leakage current of the PMOS transistor device (100B). Similarly, to the control of the gate voltage, $V_G$, control of the body voltage, $V_B$, and/or the back-gate voltage, $V_{BG}$, may be selective and in view of a mode of operation of the circuit at the load (e.g., $R_L$ of FIG. 2A later described). For example, during operation in the standby mode, the body voltage, $V_B$, and/or the back-gate voltage, $V_{BG}$, may be provided with values that are higher than those provided during operation in the active mode. This allows for a reduction of the leakage current for a better regulation and control of the current to the load (e.g., $R_L$ of FIG. 2A later described) during the standby mode of operation, and, for a stronger drive current through the PMOS transistor device (e.g., $M_{PASS}$ of FIG. 2A later described) during the active mode of operation. For example, during the active mode of operation, the body voltage, $V_B$, and/or the back-gate voltage, $V_{BG}$, may be at a level substantially equal to the source voltage, $V_S$, and during the standby mode of operation, the body voltage, $V_B$, and/or the back-gate voltage, $V_{BG}$, may be at respective levels that are higher than the source voltage, $V_S$. Such respective levels may be based on characteristics of the PMOS device which can be determined using readily available tools. It should be noted that teachings according to the present disclosure may equally apply to control of an N-type MOSFET (NMOS) transistor device (e.g., $N_{PASS}$ of FIG. 5A later described) for reducing leakage current, while considering differences in characteristics of such NMOS device when compared to a PMOS device, including polarity of voltages, or voltage differences, to control current, region of operation (e.g., sub-threshold region) and threshold voltage, Vth.

Figure 2A:
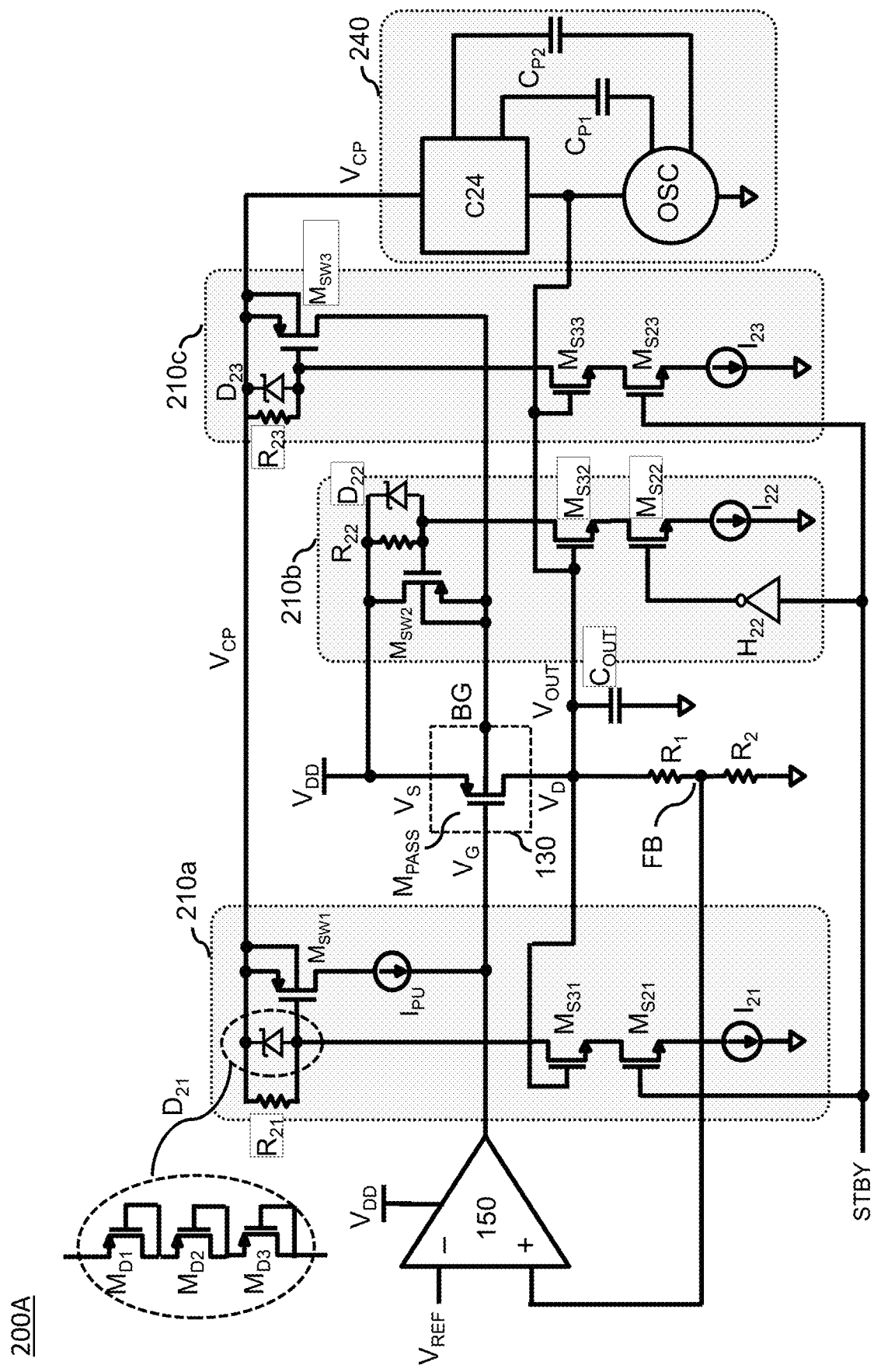
FIG. 2A shows a simplified schematic of an exemplary low voltage regulator (LDO) according to an embodiment of the present disclosure that includes control blocks for reducing a leakage current through a PMOS device during a standby mode of operation.

FIG. 2A shows a simplified schematic of an exemplary low voltage regulator (LDO, 200A) according to an embodiment of the present disclosure that includes control blocks (210a, 210b, 210c) used for reducing a leakage current through a PMOS device, $M_{PASS}$, during a standby mode of operation of a circuit powered by the output regulated voltage, $V_{OUT}$. It should be noted that the basic blocks of the LDO (200A), including (150, $M_{PASS}$, R1, R2), and their functionalities are described above with reference to FIG. 1A. In addition to the control blocks (210a, 210b, 210c), the LDO (200A) includes a circuit block (240) for generation of a voltage, $V_{CP}$, that is higher than the supply voltage, $V_{DD}$. It should be noted that in the exemplary embodiment shown in FIG. 2A, the body terminal and the back-gate terminal of the PMOS device, $M_{PASS}$, are shown tied together at a node, BG. The connection to the back-gate terminal can be made with semiconductor process technologies that are known in the art, such as substrate contacts. FIG. 2A shows such a substrate contact ring (130) that contacts the back-gate side of the PMOS device, $M_{PASS}$.

With continued reference to FIG. 2A, according to an embodiment of the present disclosure, operation of the LDO (200A) according to an active mode or an inactive/standby mode may be provided by a control signal, STBY. For example, when the control signal, STBY, is true (e.g., high), the control blocks (210a, 210b, 210c) may be configured for operation according to the standby mode, including coupling of the voltage, $V_{CP}$, to the gate, body and back-gate terminals of the PMOS device, $M_{PASS}$, and when the control signal, STBY, is false (e.g., low), the control blocks (210a, 210b, 210c) may be configured for operation according to the active mode, including coupling of the voltage, $V_{DD}$, to the gate, body and back-gate terminals of the PMOS device, $M_{PASS}$. In other words, control blocks (210a, 210b, 210c) include a voltage switching function that selectively couples different voltages (e.g., $V_{CP}$, $V_{DD}$) to the gate, G, body, B, and back-gate, BG, terminals of the PMOS device, $M_{PASS}$. In the exemplary case of FIG. 2A, the different voltages are: $V_{CP}$, coupled to the control blocks (210a, 210b, 210c) and used (switched in) by such blocks during the standby mode of operation, and $V_{DD}$, coupled to the control blocks (210a, 210b, 210c) and used (switched in) by such blocks during the active mode of operation. As will be described later with reference to FIG. 4, teachings according to the present disclosure may allow different voltages coupled to each of the gate, G, body, B, and back-gate, BG, terminals of the PMOS device, $M_{PASS}$, for operation according to the active or standby mode. In particular, enhanced control of the leakage current may be provided in view of a priori determined characteristics of the PMOS device, $M_{PASS}$, which may not necessarily require a same voltage coupled to the gate, G, body, B, and back-gate, BG, terminals of the device. Each of such different voltages may be generated via a separate voltage generation circuit block (e.g., 240 of FIG. 2A, 340 FIG. 2B, etc.).

The control block (210a) shown in FIG. 2A includes series connected (NMOS) transistors ($M_{S21}$, $M_{S31}$), in series connection with a resistor, $R_{21}$, and with a Zener diode, $D_{21}$, both the resistor $R_{21}$ and the diode $D_{21}$ coupled to the voltage, $V_{CP}$. As shown in (the dotted line region of) FIG. 2A, the Zener diode can be implemented by an exemplary stack of three devices, such as diode connected transistors (e.g., $M_{D1}$, $M_{D2}$, $M_{D3}$), to create the necessary voltage drop. Furthermore, the series connected transistors ($M_{S21}$, $M_{S31}$) are in series connection with a current source, $I_{21}$, that is coupled to a reference ground. Under control of the signal, STBY, the combination of ($M_{S21}$, $M_{S31}$, $R_{21}$, $D_{21}$, $I_{21}$) determine a gate voltage to the gate of a PMOS transistor, $M_{SW1}$, whose source is coupled to the voltage, $V_{CP}$, and drain to a current source, $I_{PU}$, that is coupled to the output of the error amplifier (150).

It should be noted that usage of the transistor, $M_{S31}$, may be based on voltages applied to the circuit shown in FIG. 2A and voltage tolerances (e.g., tolerable voltage ranges, withstand voltage) of the transistors used in the circuit, including of the transistor $M_{S21}$. As known to a person skilled in the art, series connected transistors, also known as stacked transistors, can allow to distribute/divide high voltages across the transistors, thereby allowing each of the transistors to operate within their respective voltage tolerances. In the particular case shown in FIG. 2A, the transistor $M_{S31}$ allows distribution/division of the voltage, $V_{CP}$, across two transistors, $M_{S21}$ and $M_{S31}$, thereby allowing each such transistor to operate within its voltage tolerance. In the exemplary case shown in FIG. 2A, the gate of the transistor $M_{S31}$ is biased with the output regulated voltage, $V_{OUT}$. Other bias voltages may be used so long they can satisfy operation of each of the transistors $M_{S21}$ and $M_{S31}$ within their tolerable voltage ranges.

When the control signal, STBY, is low, the transistor, $M_{S21}$, of the control block (210a) shown in FIG. 2A is turned OFF, and therefore no current flows through either of the resistor $R_{21}$, or through the Zener diode, $D_{21}$, and accordingly the gate of the PMOS transistor $M_{SW1}$ is at a same voltage, $V_{CP}$, as the source of the PMOS transistor $M_{SW1}$. On the other hand, when the control signal, STBY, is high, the transistor, $M_{S21}$, is turned ON, and therefore respective currents established by the current source $I_{21}$, flow through the resistor $R_{21}$, and through the Zener diode, $D_{21}$, and accordingly the gate of the PMOS transistor $M_{SW1}$ sees a voltage drop below the voltage, $V_{CP}$.

With continued reference to control block (210a) shown in FIG. 2A, during operation in the active mode (e.g., STBY is low), no current flows through the resistor, $R_{21}$, or through the Zener diode, $D_{21}$, and therefore the resistor $R_{21}$ biases the gate of the PMOS transistor, $M_{SW1}$, to the voltage, $V_{CP}$. In this case, the source and the gate of the PMOS transistor, $M_{SW1}$ are at a same voltage, $V_{CP}$, and therefore the transistor is OFF (e.g., inactive, no conduction). Because the PMOS transistor, $M_{SW1}$, is OFF, no current flows through the current source, $I_{PU}$, thereby effectively decoupling the output of the error amplifier (150) from the voltage, $V_{CP}$. In this case, an output voltage of the error amplifier (150) may not go above the supply voltage, $V_{DD}$, to said amplifier. In other words, during operation in the active mode, the gate voltage, $V_G$, to the PMOS device, $M_{PASS}$, is limited by the value of the supply voltage, $V_{DD}$.

On the other hand, during operation in the inactive/standby mode (e.g., STBY is high), current flows through the resistor, $R_{21}$, and through the Zener diode, $D_{21}$, of the control block (210a) of FIG. 2A, and therefore the Zener diode $D_{21}$ biases the gate of the PMOS transistor, $M_{SW1}$, to a voltage that is one Zener diode voltage drop below the voltage $V_{CP}$. Such voltage drop is selected as to turn ON (e.g., activate, conducts) the PMOS transistor, $M_{SW1}$. Accordingly, a current may flow through the current source, $I_{PU}$, which effectively couples the output of the error amplifier (150) to the voltage, $V_{CP}$. In this case, the combination of the current source, $I_{PU}$, coupled to the voltage, $V_{CP}$, may act as a pull-up circuit coupled to the output of the error amplifier (150), thereby allowing (the output stage of) the error amplifier (150) to control the gate voltage, $V_G$, to the PMOS device, $M_{PASS}$, to values up, or close, to the voltage, $V_{CP}$, and therefore to values that are higher than the value of the supply voltage, $V_{DD}$. As described above, such higher values may be in view of an error voltage input to the error amplifier (150) based on a difference of a voltage sensed at the node, FB, and the reference voltage, $V_{REF}$, such as to control a current through the PMOS device, $M_{PASS}$, thereby regulating the output voltage, $V_{OUT}$, during the standby mode of operation irrespective of how low the (demanded) standby current may be.

The control block (210c) shown in FIG. 2A includes elements ($M_{S23}$, $M_{S33}$, $R_{23}$, $D_{23}$, $I_{23}$, $M_{SW3}$) that can be likened to the above described elements ($M_{S21}$, $M_{S31}$, $R_{21}$, $D_{21}$, $I_{21}$, $M_{SW1}$) with same functionality with respect to a level of the control signal, STBY. In particular, as can be clearly understood by a person skilled in the art based on the above description, when the control signal, STBY, is low (active mode of operation), the PMOS transistor, $M_{SW3}$, is OFF, and thereby the node BG that is common to the body and the back-gate terminals of the PMOS device, $M_{PASS}$, is decoupled from the voltage, $V_{CP}$. On the other hand, when the control signal, STBY, is high (inactive/standby mode of operation), the PMOS transistor, $M_{SW3}$, is ON, and thereby the node BG is coupled to the voltage, $V_{CP}$. In other words, in dependence of a mode of operation of the LDO (200A), the control block (210c) selectively couples or decouples the node BG to/from the voltage, $V_{CP}$.

Similarly, the control block (210b) shown in FIG. 2A includes elements ($M_{S22}$, $M_{S32}$, $R_{22}$, $D_{22}$, $I_{22}$, $M_{SW2}$) that can be likened to the above described elements ($M_{S21}$, $M_{S31}$, $R_{21}$, $D_{21}$, $I_{21}$, $M_{SW1}$) with same functionality with respect to an opposite (e.g., complementary) level of the control signal, STBY. As sown in FIG. 2A, an inverter circuit, $H_{22}$, may invert a level of the control signal, STBY, prior to feeding it to the NMOS transistor, $M_{S22}$. Accordingly, as can be clearly understood by a person skilled in the art based on the above description, when the control signal, STBY, is low (active mode of operation), the PMOS transistor, $M_{SW2}$, is ON, and thereby the node BG that is common to the body and the back-gate terminals of the PMOS device, $M_{PASS}$, is coupled to the voltage, $V_{DD}$. On the other hand, when the control signal, STBY, is high (inactive/standby mode of operation), the PMOS transistor, $M_{SW2}$, is OFF, and thereby the node BG is decoupled from the voltage, $V_{DD}$. In other words, in dependence of a mode of operation of the LDO (200A), the control block (210b) selectively couples or decouples the node BG to/from the voltage, $V_{DD}$.

As described above, the circuit block (240) may be used to generate a voltage, $V_{CP}$, that is higher than the supply voltage, $V_{DD}$. As shown in FIG. 2A, according to an exemplary embodiment of the present disclosure, the voltage, $V_{CP}$, may be generated from a lower voltage, such as the output regulated voltage, $V_{OUT}$. In this case, $V_{OUT}$ is fed to the circuit block (240) which acts as a step-up voltage converter to generate the voltage, $V_{CP}$. Such step-up conversion may be provided via an oscillator, OSC, that outputs out of phase oscillations coupled to a charge pump, C24, via respective (flying) capacitors, $C_{P1}$ and $C_{P2}$, to output the voltage, $V_{CP}$. According to an exemplary embodiment of the present disclosure, the charge pump, C24, may be a 2X charge pump that is configured to output a voltage that is about two times the level of the input voltage, $V_{PUT}$. It should be noted that a person skilled in the art would clearly know of other step-up voltage converter designs/implementations that may be used to realize a voltage that is higher than the supply voltage, $V_{DD}$. Accordingly, the exemplary embodiment shown in FIG. 2A should not be construed as limiting the scope of the present disclosure.

Figure 2B:
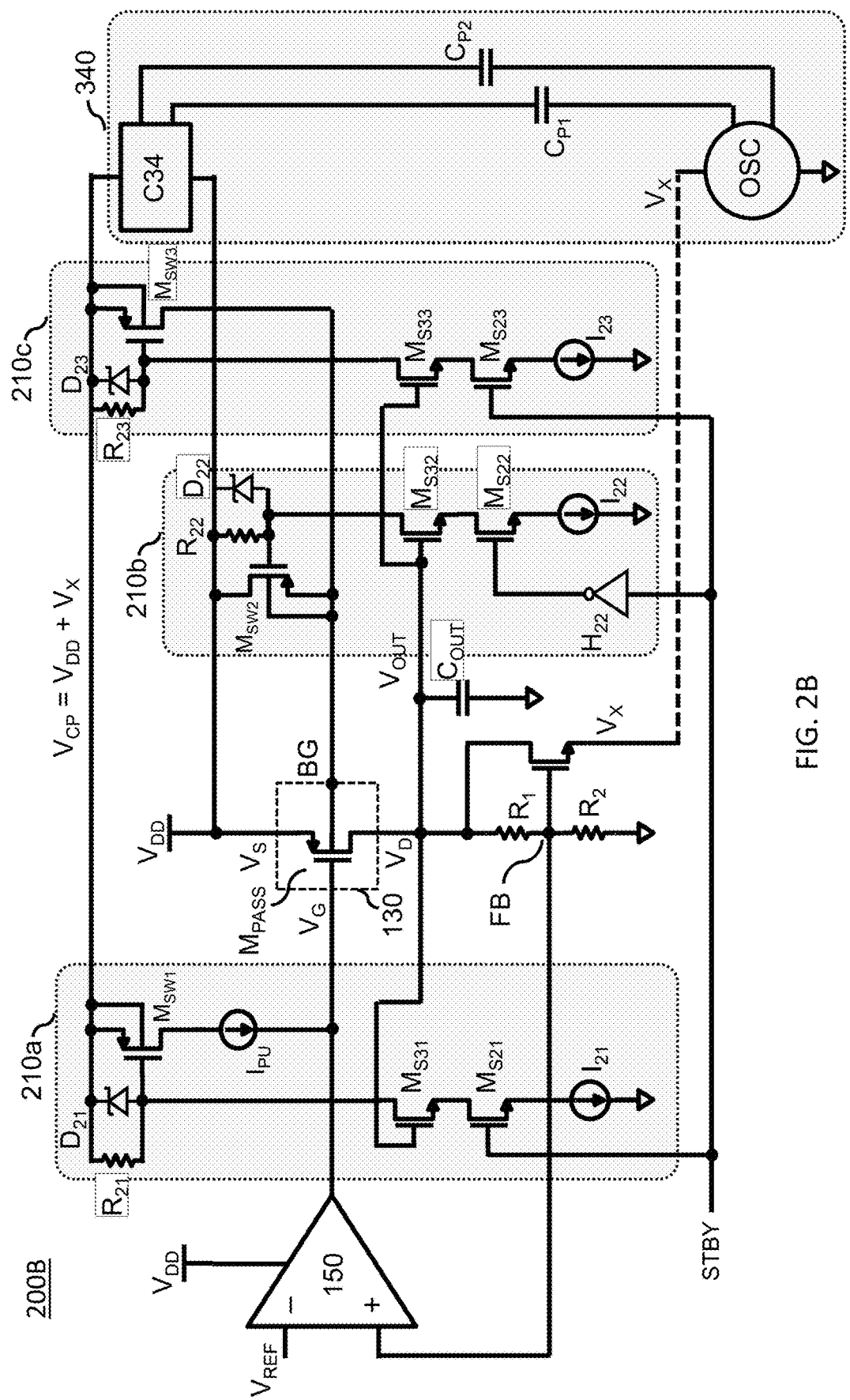
FIG. 2B shows a simplified schematic of another exemplary low voltage regulator (LDO) according to an embodiment of the present disclosure that includes control blocks for reducing a leakage current through a PMOS device during a standby mode of operation.

FIG. 2B shows a simplified schematic of another exemplary low voltage regulator (LDO, 200B) according to an embodiment of the present disclosure that includes control blocks (210a, 210b, 210c) used for reducing a leakage current through a PMOS device, $M_{PASS}$, during a standby mode of operation of a circuit powered by the output regulated voltage, $V_{OUT}$. It should be noted that functionalities of the control blocks (210a, 210b, 210c) are described above with reference to FIG. 2A. Difference between the configuration (200A) of FIG. 2A and the configuration (200B) of FIG. 2B is in the realization of the voltage, $V_{CP}$, that is higher than the supply voltage, $V_{DD}$. In the exemplary case shown in FIG. 2B, the voltage, $V_{CP}$, generated by the circuit block (340), is based not on the regulated voltage, $V_{OUT}$, per the configuration of FIG. 2A, rather on a voltage, $V_X$, and on the supply voltage, $V_{DD}$. According to an exemplary embodiment of the present disclosure, the circuit block (340) combines the voltage, $V_X$, with the supply voltage, $V_{DD}$, to output a voltage, $V_{CP}$, that is higher than the supply voltage, $V_{DD}$, by the value of the voltage, $V_X$. (e.g., $V_{CP}=V_{DD}+V_X$).

Similarly, the circuit block (340) shown in FIG. 2B also acts as a step-up voltage converter that generates the voltage $V_{CP}$ from the voltages $V_{DD}$ and $V_X$. Such step-up conversion may be provided via an oscillator, OSC, that is responsive to the $V_X$ voltage input, outputs out of phase oscillations coupled to a charge pump, C34, via respective (flying) capacitors, $C_{P1}$ and $C_{P2}$. In turn, the charge pump, C34, which also has as input the supply voltage, $V_{DD}$, uses the out of phase oscillations to output the voltage, $V_{CP}$. As noted above, a person skilled in the art would clearly know of other step-up voltage converter designs/implementations that may be used to realize a voltage that is higher than the supply voltage, $V_{DD}$. Accordingly, the exemplary embodiment shown in FIG. 2B should not be construed as limiting the scope of the present disclosure.

According to an embodiment of the present disclosure, the voltage, $V_X$, shown in FIG. 2B, may correspond to an incremental voltage above a level of the supply voltage, $V_{DD}$, that may be required for continued control (e.g., reduction) of a current through the PMOS device, $M_{PASS}$, so that the feedback loop implemented via the error amplifier (150) can regulate the output voltage, $V_{OUT}$, during the standby mode of operation. In other words, as described above, such incremental voltage may allow the PMOS device, $M_{PASS}$, to operate within its subthreshold leakage region via control of the gate voltage, $V_G$, to values above the source voltage, $V_S$. The voltage, $V_X$, may be derived from any practical source and/or circuit, including, for example, as shown in FIG. 2B, via a resistive voltage divider, which as shown in FIG. 2B, can be same divider (R1, R2) as used in generation of the sampling (sensing) voltage at the node FB. If desired, an additional series connected resistor may be added to the divider (R1, R2) to provide a voltage $V_X$ that is different from the sampling voltage at the node FB.

Figure 2C:
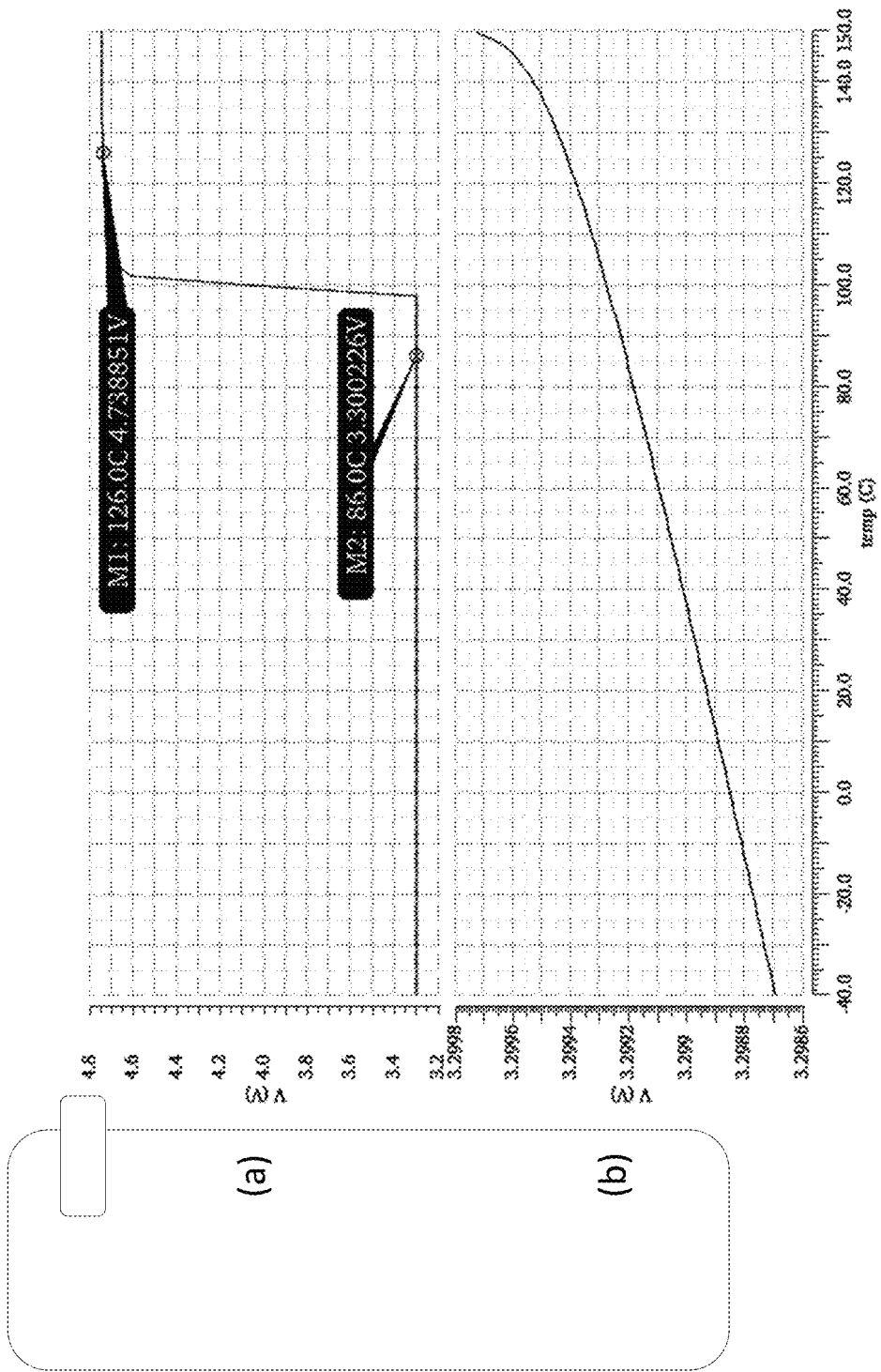
FIG. 2C shows graphs representative of voltage regulation performance of the prior art LDO of FIG. 1A compared to the LDO of FIG. 2A.

FIG. 2C shows graphs representative of voltage regulation performance of the prior art LDO of FIG. 1A compared to the LDO of FIG. 2A or FIG. 2B described above. In particular, such graphs represent simulation results of LDO performances in standby mode of operation with respect to temperature variation. As temperature increases, leakage current in the PMOS device (e.g., $M_{PASS}$ of FIGS. 1A, 2A, 2B) increases, and therefore to maintain output voltage (e.g., $V_{OUT}$ of FIGS. 1A, 2A, 2B) regulation, the PMOS device must be controlled to reduce its leakage current. As can be seen in the top graph (a) of FIG. 2C, the prior art LDO configuration can maintain regulation up to a temperature of about 98 degrees centigrade, after which regulation is lost and the output voltage, $V_{OUT}$, steps up to a level close to the supply voltage (e.g., $V_{DD}$ of about 4.75 volts) (this is the loss of regulation problem described in the above Background section of the present disclosure, in this case triggered by higher temperature). On the other hand, as can be seen in the bottom graph (b) of FIG. 2C, represented with a much finer voltage scale compared to the top graph (a), the LDO configuration according to the present teachings maintains output voltage, $V_{OUT}$, regulation up to temperatures beyond 140 degrees centigrade. As described above, by allowing control of the gate voltage to values higher than the source voltage of the PMOS device (e.g., $M_{PASS}$ of FIGS. 2A and 2B), combined with the control of the threshold voltage, Vth, via applying of different voltages to the body and/or back-gate of said PMOS device, a wider dynamic range for control of the (leakage) current through the PMOS device is rendered possible by the present teachings. Accordingly, as shown in FIG. 2C, such wider dynamic range of control allows for an enhanced regulation of the output voltage.

Figure 3A:
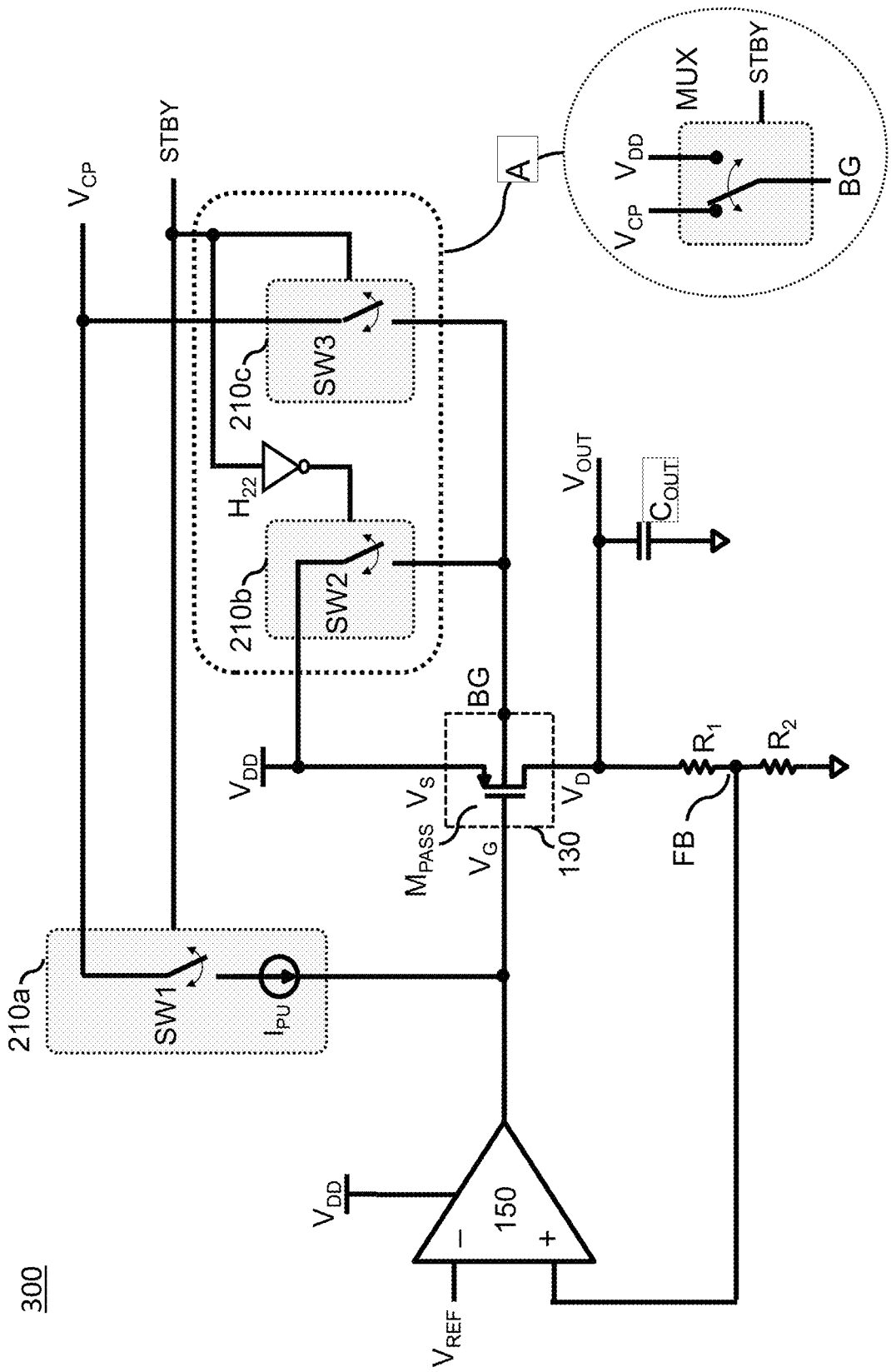
FIG. 3A shows an equivalent representation of the low voltage regulators (LDOs) of FIG. 2A and FIG. 2B.
Figure 3B:
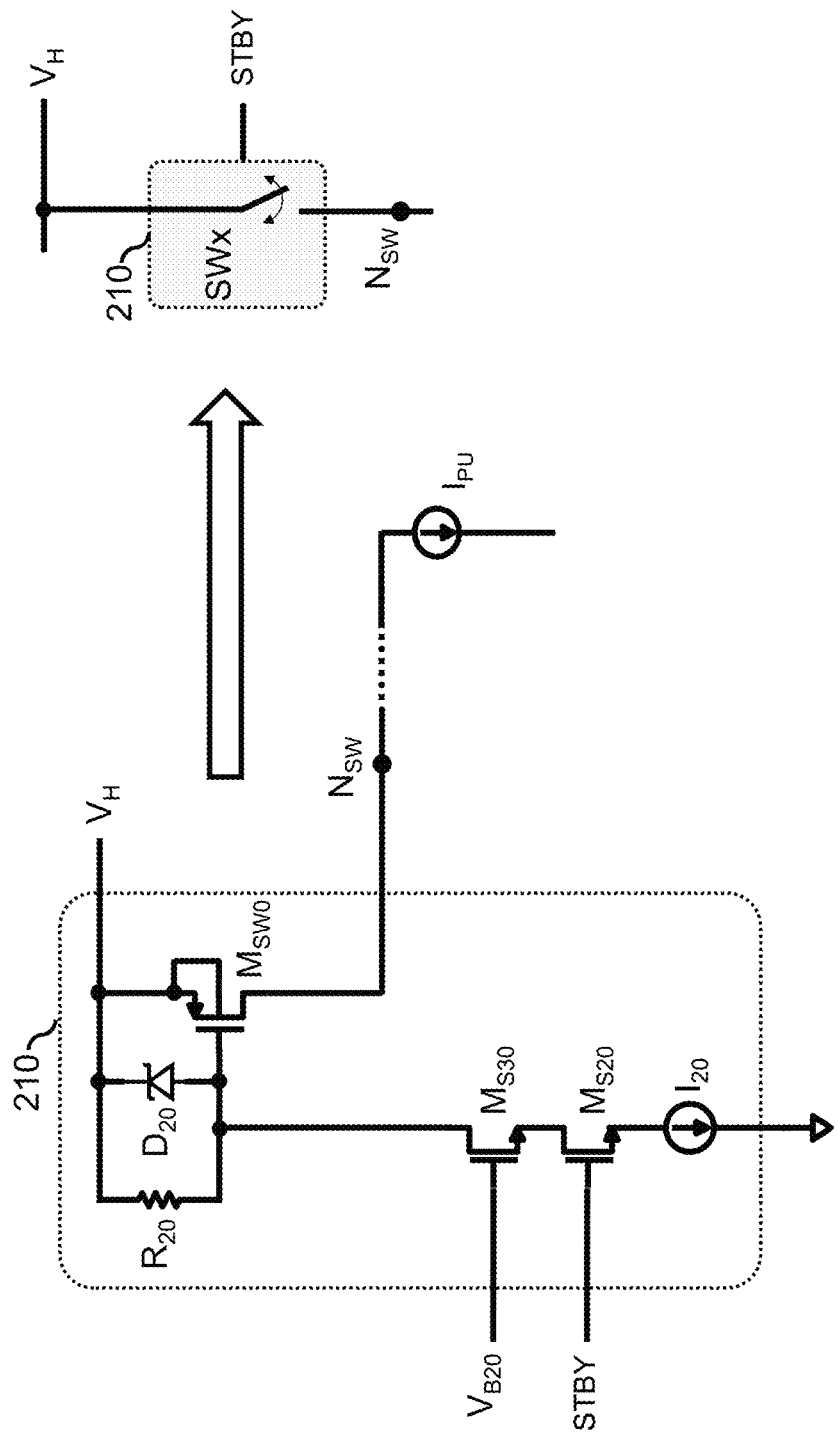
FIG. 3B shows details of a switch circuit that can be used in control blocks shown in FIG. 3A.

FIG. 3A shows an equivalent representation of the low dropout regulators (LDOs) of FIG. 2A and FIG. 2B. As described above, and shown in FIG. 3A, each of the control blocks (210a, 210b, 210c) includes a voltage switching function that selectively couples different voltages (e.g., $V_{CP}$, $V_{DD}$) to the gate, G, body, B, and back-gate, BG, terminals of the PMOS device, $M_{PASS}$. As shown in FIG. 3A, each such voltage switching function can be likened to a (single -pole single throw, SPST) switch (e.g., SW1, SW2, SW3) that under control of the control signal, STBY, switches in or out a voltage (e.g., $V_{DD}$, $V_{CP}$) at a first terminal of the switch to a second terminal of the switch. In the exemplary case of FIGS. 2A and 2B, each of the switches (e.g., SW1, SW2, SW3) may be implemented via the switch circuit (210, $SW_X$) shown in FIG. 3B, including elements ($M_{S20}$, $M_{S30}$, $R_{20}$, $D_{20}$, $I_{20}$, $M_{SW0}$), operable according to the description above with reference to, for example, elements ($M_{S21}$, $M_{S31}$, $R_{21}$, $D_{21}$, $I_{21}$, $M_{SW1}$) of FIGS. 2A and 2B, such as, for example, under control of the signal, STBY, an output node (e.g., generically denoted as $N_{SW}$ in FIG. 3B) of the switch circuit (210, $SW_X$) is coupled to, or decoupled from, a voltage, $V_H$ (e.g., $V_{DD}$, $V_{CP}$), at an input of the switch circuit (210, $SW_X$). However, it should be noted that the switch circuit (210, $SW_X$) of FIG. 3B may represent one exemplary implementation of the switching function, as a person skilled in the art may know of other design/implementation examples.

With further reference to FIG. 3A, and based on the above description of the control blocks (210b) and (210c), a person skilled in the art will clearly realize that such blocks, in combination, provide the functionality of a voltage multiplexer, or in other words a voltage switching circuit, that as shown in the detail A of FIG. 3A, under control of the STBY signal, outputs one of two voltages, in this case, the voltage $V_{DD}$ when a level of the control signal STBY is low, or the voltage $V_{CP}$ when the level of the control signal STBY is high, to an output terminal that in this case, is coupled to the node, BG. As shown in the detail A of FIG. 3A, such voltage multiplexer circuit may be considered as a single-pole double-throw (SPDT) switch that under control of the control signal, STBY, switches one of two voltages (e.g., $V_{DD}$, $V_{CP}$) at respective first and second terminals of the switch to a third terminal of the switch. A person skilled in the art may know of other designs/implementations that may be used to realize a voltage multiplexer circuit for use in the LDO according to the present teachings.

Figure 4:
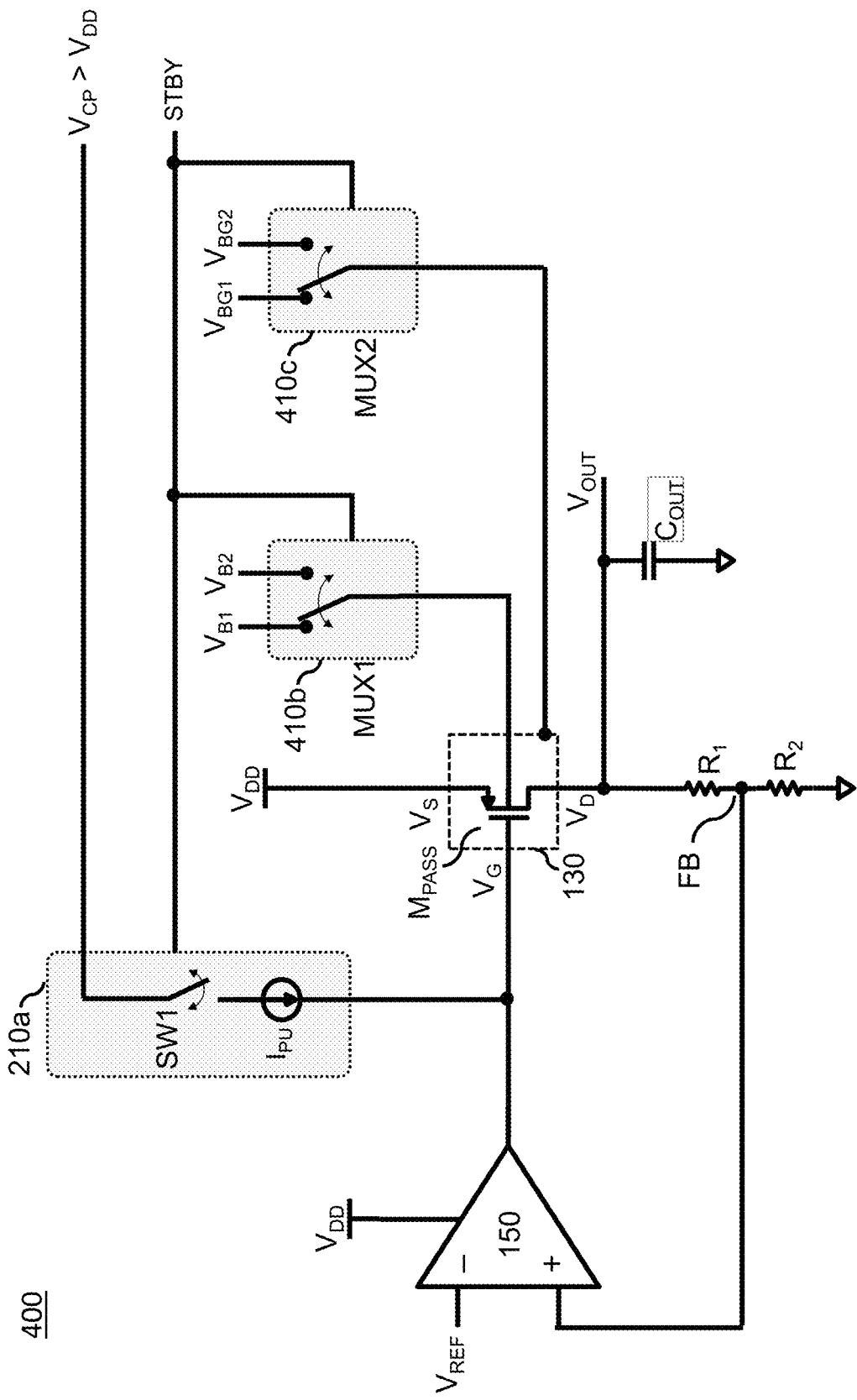
FIG. 4 shows a simplified schematic of a generic low voltage regulator (LDO) according to an embodiment of the present disclosure that includes control blocks for reducing a leakage current through a PMOS device during a standby mode of operation.

FIG. 4 shows a simplified schematic of a generic low voltage regulator (LDO, 400) according to an embodiment of the present disclosure that includes control blocks (210a, 410b, 410c) for reducing a leakage current through a PMOS device, $M_{PASS}$, during a standby mode of operation. In particular, the control block (210a) may include a switch, SW1, described above with reference to FIG. 3A, that may be used to selectively couple a voltage, $V_{CP}$, that is higher than the supply voltage, $V_{DD}$, to the output of the error amplifier (150). A control block (410b) may include a voltage multiplexer circuit, MUX1, described above with reference to FIG. 3A, that may be used to selectively couple one of two voltages ($V_{B1}$, $V_{B2}$) to a body of the PMOS device, $M_{PASS}$. As described above with reference to FIG. 3A, according to some exemplary embodiments, the voltages ($V_{B1}$, $V_{B2}$) may be equal to, for example, ($V_{CP}$, $V_{DD}$). Furthermore, control block (410c), may include a voltage multiplexer circuit, MUX2, described above with reference to FIG. 3A, that may be used to selectively couple one of two voltages ($V_{BG1}$, $V_{BG2}$) to a back-gate (130) of the PMOS device, $M_{PASS}$.

The various voltages shown in FIG. 4, including ($V_{CP}$, $V_{B1}$, $V_{B2}$, $V_{BG1}$, $V_{BG2}$), may be generated via any circuit known in the art, and based on readily available voltages. Some nonlimiting exemplary implementations are described above with reference to item (240) of FIG. 2A and item (340) of FIG. 2B. Furthermore, as described above, levels of such voltages may be based on characteristics of the device under control, in this case, the PMOS device, $M_{PASS}$, such as to a) extend operation of the device under control further into its subthreshold leakage region, and b) controlling the threshold voltage, Vth, of the device under control. As can be seen clearly from the above description, controlling of the threshold voltage, Vth, may include increasing such voltage during a standby mode of operation and decreasing such voltage under an active mode of operation. It should be noted that although the configuration (400) shown in FIG. 4 allows flexibility in the voltages applied to the gate, body and back-gate terminals of the PMOS device, $M_{PASS}$, it also allows flexibility to invoke or not switching of voltages applied to said terminals. In other words, depending on performance goals, one may decide, for example, to not switch voltages to the back-gate terminal between the standby and active mode of operation, or to always activate/couple the pull-up circuit block (210a) at the output of the error amplifier (150).

Figure 5A:
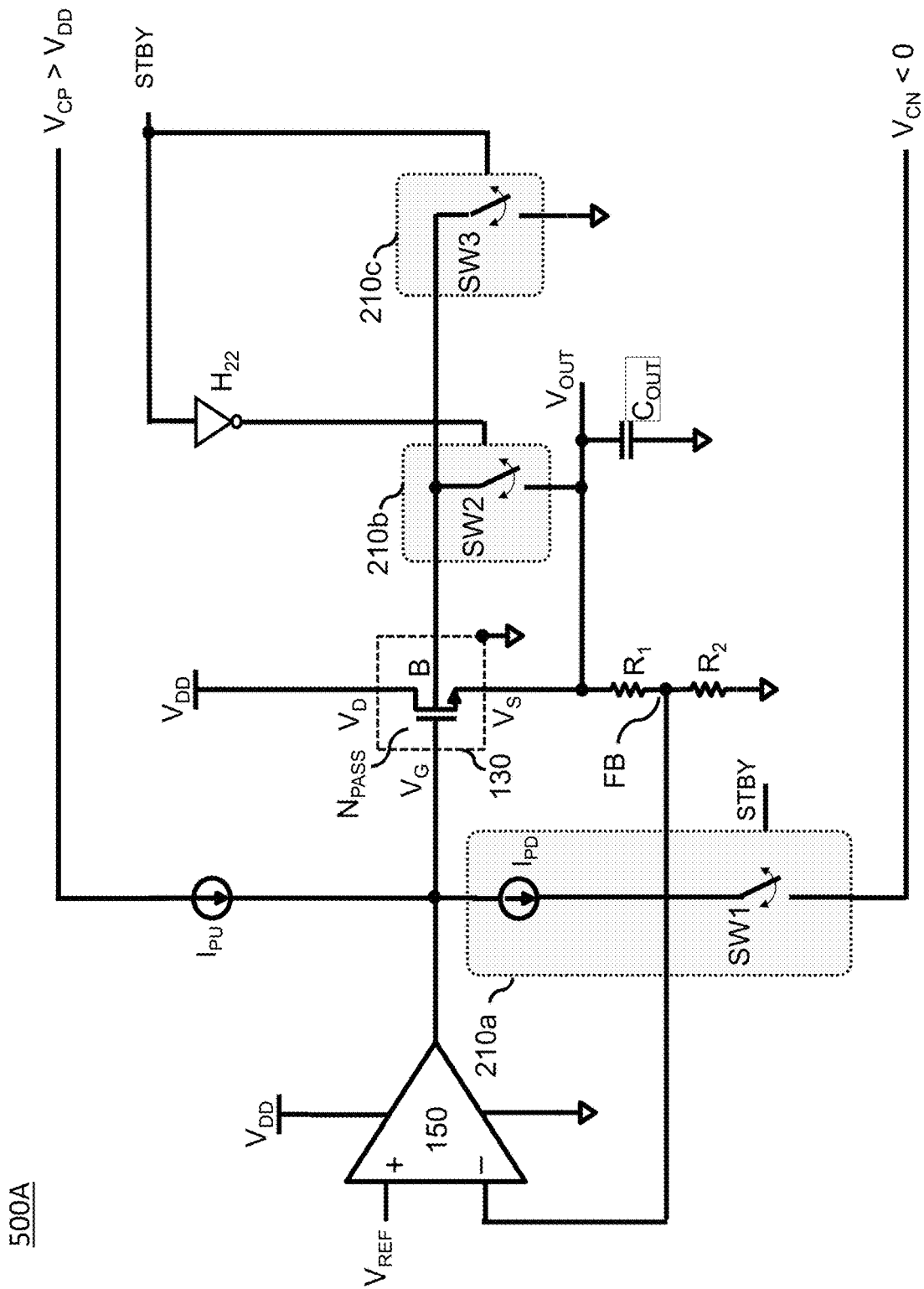
FIG. 5A shows a simplified schematic of a low voltage regulator (LDO) according to an embodiment of the present disclosure that includes control blocks for reducing a leakage current through an NMOS device during a standby mode of operation.
Figure 6:
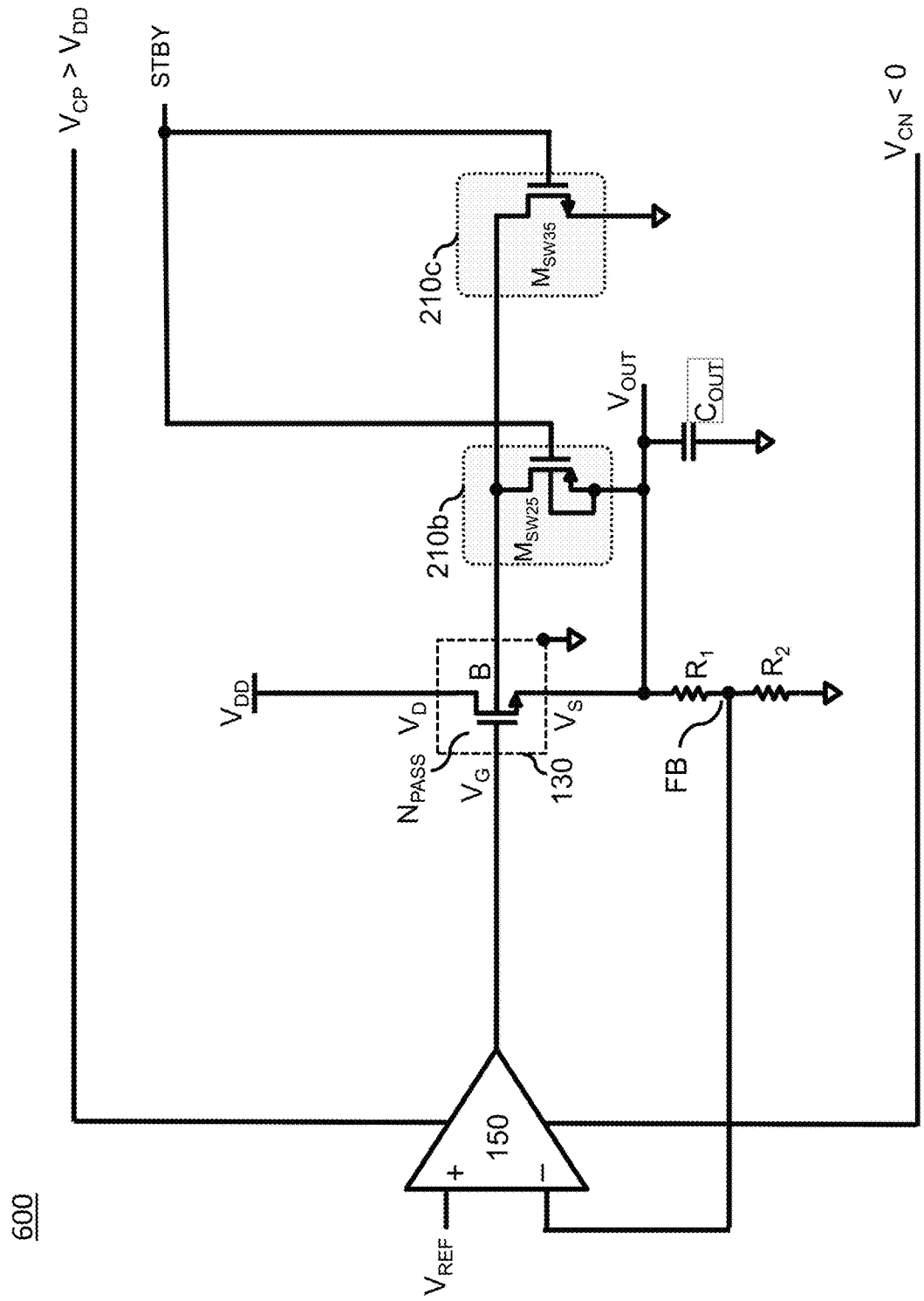
FIG. 6 shows one exemplary implementation based on the configuration shown in FIG. 5A.

As described above, teachings according to the present disclosure are not limited to control of a PMOS device, and may equally apply to an NMOS device, $N_{PASS}$, as shown in FIG. 5A. Control blocks (210a, 210b, 210c, 410b) may provide same functionality as the control blocks (210a, 210b, 210c) described above with reference to FIG. 2A-2B, FIG. 3A and FIG. 4, including the switching functionalities SW1, SW2 and SW3, to provide different voltages to the gate terminal and the body terminal of the NMOS device, $N_{PASS}$, and not to both of the body and the back-gate terminals. As shown in FIG. 5A, the back-gate terminal may be maintained at the reference ground throughout operation of the NMOS device, $N_{PASS}$. Alternatively, the back-gate terminal as well as the body terminal may be connected to a voltage below ground (not shown in FIG. 5A), similar to the gate terminal, such that that it increases the threshold voltage Vth and decreases leakage through the NMOS device. The manner in which a voltage below ground (or in other words a negative voltage) is generated can be based on the nonlimiting exemplary implementations in (240) of FIG. 2A and item (340) in FIG. 2B. The charge pump C24 on FIG. 2A and C34 in FIG. 2B would be configured to generate a negative voltage, $V_{CN}$, with respect to ground instead of a positive voltage with respect to $V_{OUT}$ or $V_{DD}$ as shown.

In order to achieve the same low dropout voltage from $V_{DD}$ to $V_{OUT}$ as an LDO with PMOS pass device, an LDO with NMOS pass device will require the gate of the NMOS pass device to be forced higher than $V_{DD}$. This higher gate voltage is realized by a current source from a voltage higher than $V_{DD}$ ($V_{CP}$) which can be generated based on the nonlimiting exemplary implementations in (240) of FIG. 2A and item (340) in FIG. 2B. Alternatively, the error amplifier (150) can be supplied from $V_{CP}$ directly (e.g., configuration 600 of FIG. 6), so that it has the ability to force gate of NMOS pass gate directly from its output. Similar to the PMOS device, an NMOS device's leakage current can be reduced by operating the device further into subthreshold region. This is accomplished by driving $V_{GS}$ less positive (or even negative) than the Vth of the NMOS device. The control block (210a) is used for adjusting $V_{GS}$ of $N_{PASS}$ negative in standby mode, and include a switch, SW1, along with a current source $I_{PD}$ that may be used to selectively couple a voltage, $V_{CN}$, that is lower than the reference ground (e.g., negative) to the output of the error amplifier (150).

With continued reference to FIG. 5A, during operation in the standby mode, the combination of the control blocks (210b, 210c) couple the body of the NMOS device, $N_{PASS}$, to the reference ground, thereby increasing the threshold voltage, Vth, of the device by forcing the body-to-source voltage ($V_{BS}=V_B-V_S$) negative. On the other hand, during operation in the active mode, the combination of the control blocks (210b, 210c) couple the body of the NMOS device, $N_{PASS}$, to its source, thereby increasing performance of the device for a higher output current.

Figure 5B:
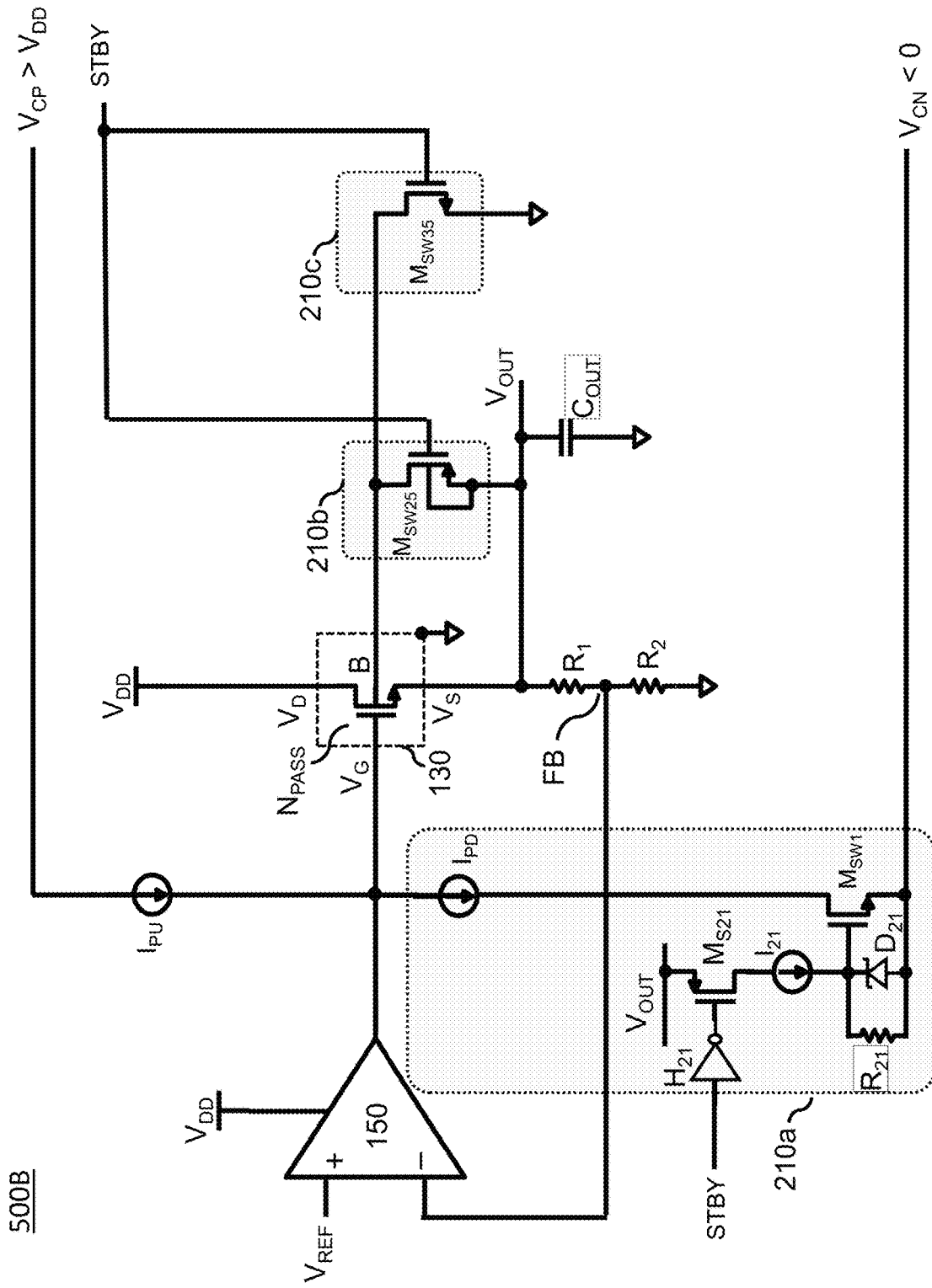
FIG. 5B shows one exemplary implementation based on the configuration shown in FIG. 5A.

FIG. 5B shows one exemplary implementation (500B) based on the configuration (500A) described above with reference to FIG. 5A. In the exemplary implementation (500B), respective switching functionalities SW1, SW2, and SW3 of the control blocks (210a), (210b) and (210c) may be provided by NMOS transistor $M_{SW1}$, a PMOS transistor, $M_{SW2S}$, and an NMOS transistor, $M_{SW3S}$. When the control signal, STBY, is high, the NMOS transistor, $M_{SW3S}$, is ON, and the PMOS transistor, $M_{SW2S}$, is OFF, therefore the body of the NMOS device, $N_{PASS}$, is coupled to the reference ground. On the other hand, when the control signal, STBY, is low, the NMOS transistor, $M_{SW3S}$, is OFF, and the PMOS transistor, $M_{SW2S}$, is ON, therefore the body of the NMOS device, $N_{PASS}$, is coupled to the source of the NMOS device, $N_{PASS}$, and therefore to $V_{OUT}$.

The control block (210a) shown in FIG. 5B includes PMOS transistor $M_{S21}$ in series connection with current source $I_{21}$ which in turn is in series with a resistor, $R_{21}$, and with a Zener diode, $D_{21}$, both the resistor $R_{21}$ and the diode $D_{21}$ coupled to the voltage, $V_{CN}$. As described above with reference to FIG. 2A, the Zener diode, $D_{21}$, can be implemented by an exemplary stack of three devices, such as diode connected transistors (e.g., $M_{D1}$, $M_{D2}$, $M_{D3}$ of FIG. 2A), to create the necessary voltage drop. Furthermore, $M_{S21}$ is coupled to the output voltage $V_{OUT}$ while the gate of $M_{S21}$ is coupled to inverter $H_{21}$ that inverts the control signal STBY. It should be noted that $M_{S21}$ can couple to any other suitable voltage, such as another supply voltage or bias voltage, that is capable of supplying the current into $I_{21}$ current source. Under control of the signal, STBY, the combination of ($M_{S21}$, $I_{21}$, $R_{21}$, $D_{21}$) determine a gate voltage to the gate of a NMOS transistor, $M_{SW1}$, whose source is coupled to the voltage, $V_{CN}$, and drain to a current source, $I_{PD}$, that is coupled to the output of the error amplifier (150).

When the control signal, STBY, is low, the transistor, $M_{S21}$, of the control block (210a) shown in FIG. 2A is turned OFF by inverter $H_{21}$, and therefore no current flows through either of the resistor $R_{21}$, or through the Zener diode, $D_{21}$, and accordingly the gate of the NMOS transistor $M_{SW1}$ is at a same voltage, $V_{CN}$, as the source of the NMOS transistor $M_{SW1}$. On the other hand, when the control signal, STBY, is high, the transistor, $M_{S21}$, is turned ON, and therefore respective currents established by the current source $I_{21}$, flow through the resistor $R_{21}$, and through the Zener diode, $D_{21}$, and accordingly the gate of the NMOS transistor $M_{SW1}$ sees a sufficiently high voltage above $V_{CN}$ that allows $M_{SW1}$ to turn ON.

With continued reference to control block (210a) shown in FIG. 5B, during operation in the active mode (e.g., STBY is low), no current flows through the resistor, $R_{21}$, or through the Zener diode, $D_{21}$, and therefore the resistor $R_{21}$ biases the gate of the NMOS transistor, $M_{SW1}$, to the voltage, $V_{CN}$. In this case, the source and the gate of the NMOS transistor, $M_{SW1}$ are at a same voltage, $V_{CN}$, and therefore the transistor is OFF (e.g., inactive, no conduction). Because the NMOS transistor, $M_{SW1}$, is OFF, no current flows through the current source, $I_{PD}$, thereby effectively decoupling the output of the error amplifier (150) from the voltage, $V_{CN}$. In this case, an output voltage of the error amplifier (150) may not go below ground reference of the said amplifier. In other words, during operation in the active mode, the gate voltage, $V_G$, to the NMOS device, $N_{PASS}$, is limited to positive values, and may not go negative.

On the other hand, during operation in the inactive/standby mode (e.g., STBY is high), current flows through the resistor, $R_{21}$, and through the Zener diode, $D_{21}$, of the control block (210a) of FIG. 5B, and therefore the Zener diode $D_{21}$ biases the gate of the NMOS transistor, $M_{SW1}$, to a voltage that is one Zener diode voltage drop above voltage $V_{CN}$. Such voltage drop is selected as to turn ON (e.g., activate, conducts) the NMOS transistor, $M_{SW1}$. Accordingly, a current may flow through the current source, $I_{PD}$, which effectively couples the output of the error amplifier (150) to the voltage, $V_{CN}$. In this case, the combination of the current source, $I_{PD}$, coupled to the voltage, $V_{CN}$, may act as a pull-down circuit coupled to the output of the error amplifier (150), thereby allowing (the output stage of) the error amplifier (150) to control the gate voltage, $V_G$, to the NMOS device, $N_{PASS}$, to values down, or close, to the voltage, $V_{CN}$, and therefore to values that are lower than ground, i.e. negative voltages. As described above, such negative voltages may be in view of an error voltage input to the error amplifier (150) based on a difference of a voltage sensed at the node, FB, and the reference voltage, $V_{REF}$, such as to control a current through the NMOS device, $N_{PASS}$, thereby regulating the output voltage, $V_{OUT}$, during the standby mode of operation irrespective of how low the (demanded) standby current may be.

It should be noted that the teachings according to the present disclosure should not be considered as limited to LDO designs and implementations, as such teachings may equally apply to any application that may require controlling/reducing leakage currents through a PMOS or an NMOS device, via, control of respective gate voltages as well as, if required, body and/or back-gate voltages. Some target application may include, but not limited to, large CMOS digital blocks, and bias generators/controllers with large PMOS devices. Control/reduction of leakage currents in NMOS devices (e.g., shunt regulators) may include selective coupling of large negative voltages (i.e., voltages below the reference ground) to one or more of a gate, body or back-gate terminals of the NMOS devices.

Furthermore, teachings according to the present disclosure describe selective biasing of PMOS or NMOS transistors to improve their performance during a standby mode of operation by reducing their leakage currents. Similarly, the present teachings may be used for selective biasing of the PMOS or NMOS transistors, via for example, back-gate biasing, to render such transistors "stronger" for power/performance/area optimization during an active mode of operation.

Figure 7:
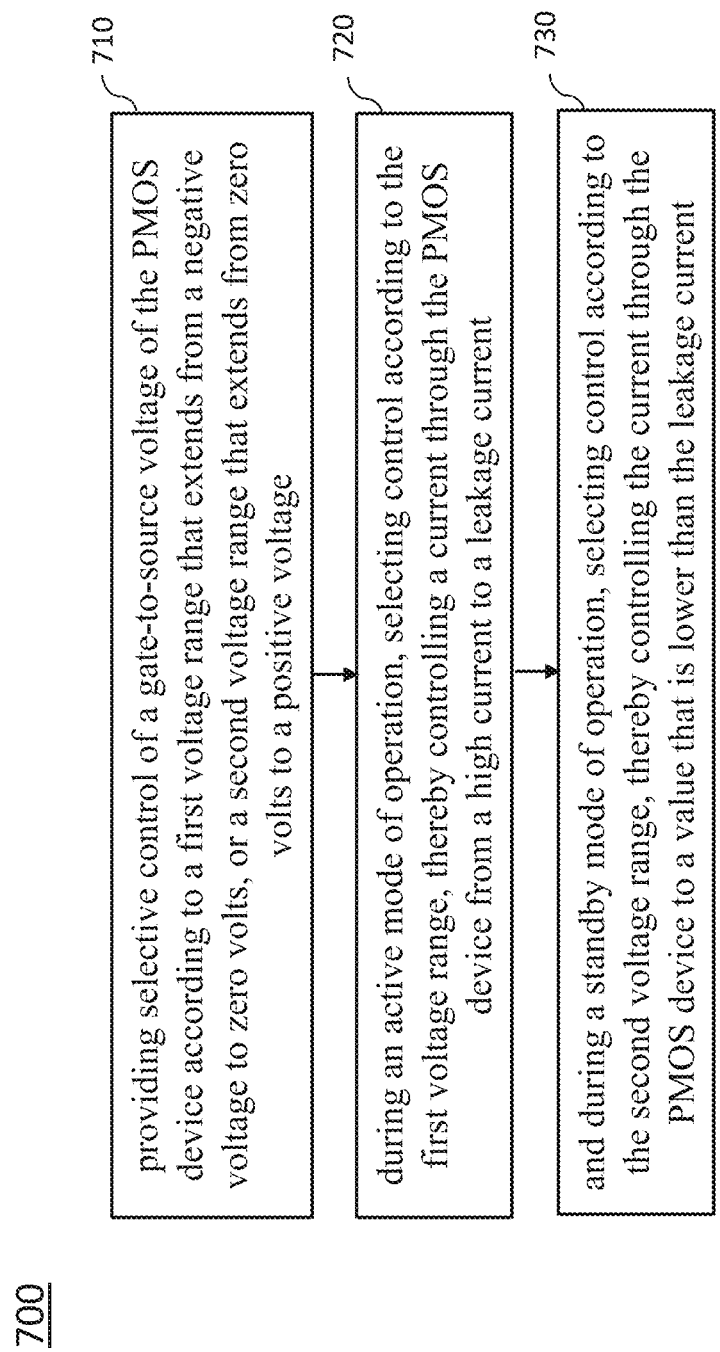
FIG. 7 is a process chart showing various steps of a method according to the present disclosure for reducing leakage current through a PMOS device.

FIG. 7 is a process chart (700) showing various steps of a method for reducing leakage current through a PMOS device. As shown in FIG. 7, such steps comprise: providing selective control of a gate-to-source voltage of the PMOS device according to a first voltage range that extends from a negative voltage to zero volts, or a second voltage range that extends from zero volts to a positive voltage, according to step (710); during an active mode of operation, selecting control according to the first voltage range, thereby controlling a current through the PMOS device from a high current to a leakage current, according to step (720); and during a standby mode of operation, selecting control according to the second voltage range, thereby controlling the current through the PMOS device to a value that is lower than the leakage current, according to step (730).

It should be noted that the various embodiments of the circuits for leakage reduction in MOS devices according to the present disclosure may be implemented as a monolithically integrated circuit (IC) according to any fabrication technology and process known to a person skilled in the art.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A circuital arrangement, comprising:
   a PMOS transistor device comprising:
      a source terminal coupled to a supply voltage;
      a drain terminal configured to be coupled to a load; and
      a gate terminal configured to control a current between the source terminal and the drain terminal;
   an error amplifier comprising an output coupled to the gate terminal, the error amplifier powered by the supply voltage; and
   a voltage switching circuit configured to selectively couple a first high voltage that is higher than the supply voltage to the output of the error amplifier,
   wherein
      the circuital arrangement is configured to operate according to at least a first mode and a second mode,
      during operation in the first mode, the voltage switching circuit decouples the first high voltage from the output of the error amplifier so that an upper bound of a range of a control voltage at the output of the error amplifier is provided by the supply voltage, and
      during operation in the second mode, the voltage switching circuit couples the first high voltage to the output of the error amplifier so to extend the range of the control voltage above the supply voltage.

2. The circuital arrangement of claim 1, wherein:
   during operation in the first mode and the second mode, the error amplifier outputs the control voltage based on an error voltage equal to a difference between:

a scaled version of a voltage at the drain terminal that is provided to a positive terminal of the error amplifier; and a reference voltage that is provided to a negative terminal of the error amplifier.

3. The circuital arrangement of claim 2, further comprising:

a resistive voltage divider comprising first and second series connected resistors coupled to the drain terminal, the resistive voltage divider configured to generate the scaled version of the voltage at the second terminal.

4. The circuital arrangement of claim 1, wherein the voltage switching circuit comprises:

a switch in series connection with a first current source, the switch and the first current source coupled between the first high voltage and the output of the error amplifier.

5. The circuital arrangement of claim 4, wherein:

a first terminal of the switch is coupled to the first high voltage; and the first current source is coupled between a second terminal of the switch and the output of the error amplifier.

6. The circuital arrangement of claim 4, wherein:

the switch is a PMOS transistor switch, the first terminal of the switch is a source terminal of the PMOS transistor switch, the second terminal of the switch is a drain terminal of the PMOS transistor switch, and the voltage switching circuit further comprises a resistor and a diode, wherein respective first terminals of the resistor and the diode are coupled to a gate terminal of the PMOS transistor switch, and respective second terminals of the resistor and the diode are coupled to the first high voltage.

7. The circuital arrangement of claim 6, wherein the diode is implemented by a plurality of diode-connected transistors arranged in series.

8. The circuital arrangement of claim 6, wherein:

the voltage switching circuit further comprises an NMOS transistor in series connection with a second current source, a drain terminal of the NMOS transistor is coupled to the gate of the PMOS transistor switch, a source terminal of the NMOS transistor is coupled to the second current source, and a gate terminal of the NMOS transistor is coupled to a control signal that has a low level during operation in the first mode, and has a high level during operation in the second mode.

9. The circuital arrangement of claim 8, wherein:

the drain terminal of the NMOS transistor is couped to the gate of the PMOS transistor through an additional NMOS transistor.

10. The circuital arrangement of claim 1, wherein:

the PMOS transistor device further comprises a body terminal, and the circuital arrangement further comprises a voltage multiplexing circuit configured to couple the body terminal to:

the supply voltage during operation in the first mode, and to a second high voltage that is higher than the supply voltage during operation in the second mode.

11. The circuital arrangement of claim 10, wherein:

the PMOS transistor device further comprises a back-gate terminal coupled to the body terminal.

12. The circuital arrangement of claim 10, wherein:

the second high voltage is a same voltage as the first high voltage.

13. The circuital arrangement of claim 1, wherein:

the PMOS transistor device further comprises a back-gate terminal, and the circuital arrangement further comprises an additional voltage multiplexing circuit configured to couple the back-gate terminal to:

the supply voltage during operation in the first mode, and to a third high voltage that is higher than the supply voltage during operation in the second mode.

14. The circuital arrangement of claim 1, wherein:

the range of the control voltage during operation in the first mode is configured to drive a gate-to-source voltage of the PMOS transistor device from negative voltage values to zero volts, and an extended range of the control voltage during operation in the second mode is configured to drive the gate-to-source voltage of the PMOS transistor device from negative voltage values to positive voltage values.

15. The circuital arrangement of claim 1, wherein:

the range of the control voltage during operation in first mode comprises a high voltage at a level of about the supply voltage that is configured to drive the PMOS transistor device into a subthreshold leakage region, and an extended range of the control voltage during operation in the second mode comprises a high voltage at a level of about the first high voltage that is configured to drive the PMOS transistor device further into the subthreshold leakage region.

16. The circuital arrangement of claim 10, wherein:

a level of the second high voltage is configured to increase a level of a threshold voltage of the PMOS transistor device during operation in the second mode when compared to a level of the threshold voltage during operation in the first mode.

17. The circuital arrangement of claim 13, wherein:

a level of the second high voltage and a level of the third high voltage are configured to increase a level of a threshold voltage of the PMOS transistor device during operation in the second mode when compared to a level of the threshold voltage during operation in the first mode.

18. The circuital arrangement of claim 1, wherein:

the first mode corresponds to an active mode of operation of the load wherein the load is configured to draw a large current through the PMOS transistor device, and the second mode corresponds to a standby mode of operation of the load wherein the load is configured to draw a current smaller than an OFF current of the PMOS transistor device when in the first mode.

19. The circuital arrangement of claim 1, wherein:

the PMOS transistor device is fabricated using one of: a) silicon-on-insulator (SOI) technology, b) silicon-on-sapphire (SOS) technology, or c) bulk silicon (Si) technology.

20. The circuital arrangement of claim 1, wherein:

the circuital arrangement is monolithically integrated.

21. An electronic module comprising the circuital arrangement of claim 1.

22. A circuital arrangement, comprising:
an NMOS transistor device comprising:
- a drain terminal coupled to a supply voltage;
- a source terminal configured to be coupled to a load; and
- a gate terminal configured to control a current between the drain terminal and the source terminal;

an error amplifier comprising an output coupled to the gate terminal; and a voltage switching circuit configured to selectively couple a low voltage that is lower than a reference ground voltage to the output of the error amplifier, wherein
- the circuital arrangement is configured to operate according to at least a first mode and a second mode,
- during operation in the first mode, the voltage switching circuit decouples the low voltage from the output of the error amplifier so that a lower bound of a range of a control voltage at the output of the error amplifier is provided by the reference ground voltage, and
- during operation in the second mode, the voltage switching circuit couples the low voltage to the output of the error amplifier so to extend the range of the control voltage below the reference ground voltage.

23. The circuital arrangement of claim 22, further comprising a voltage multiplexing circuit configured to couple a body terminal of the NMOS transistor device to:
the source terminal during operation in the first mode, and
to the reference ground during operation in the second mode.

\* \* \* \* \*